(12) United States Patent
Mochida

(10) Patent No.: US 8,649,233 B2
(45) Date of Patent: Feb. 11, 2014

(54) SEMICONDUCTOR DEVICE

(76) Inventor: Noriaki Mochida, Tokyo (JP)

( * ) Notice: Subject to any disclaimer, the term of this patent is extended or adjusted under 35 U.S.C. 154(b) by 176 days.

(21) Appl. No.: 13/276,919

(22) Filed: Oct. 19, 2011

(65) Prior Publication Data
US 2012/0120747 A1    May 17, 2012

(30) Foreign Application Priority Data

Nov. 12, 2010  (JP) ................................. 2010-253909

(51) Int. Cl.
*G11C 7/22*        (2006.01)
*G11C 8/18*        (2006.01)

(52) U.S. Cl.
USPC ................. 365/194; 365/189.14; 365/189.17; 365/230.06; 365/233.1; 365/233.19; 365/230.03

(58) Field of Classification Search
USPC .................. 365/189.14, 189.17, 194, 230.03, 365/230.06, 233.1, 233.19
See application file for complete search history.

(56) References Cited

U.S. PATENT DOCUMENTS

| | | | | |
|---|---|---|---|---|
| 4,800,530 A | * | 1/1989 | Itoh et al. | 365/189.12 |
| 6,002,282 A | * | 12/1999 | Alfke | 327/165 |
| 6,061,294 A | * | 5/2000 | Koshikawa | 365/233.11 |
| 6,130,846 A | * | 10/2000 | Hori et al. | 365/203 |
| 6,130,849 A | * | 10/2000 | Kawabata et al. | 365/207 |
| 6,304,509 B1 | * | 10/2001 | Hirobe et al. | 365/230.03 |
| 6,434,736 B1 | * | 8/2002 | Schaecher et al. | 716/111 |
| 7,230,862 B2 | * | 6/2007 | Kim et al. | 365/194 |
| 2009/0231945 A1 | * | 9/2009 | Faue | 365/230.03 |
| 2010/0246278 A1 | * | 9/2010 | Frey | 365/189.05 |

FOREIGN PATENT DOCUMENTS

| | | |
|---|---|---|
| JP | 8-221978 | 8/1996 |
| JP | 2000-11647 | 1/2000 |
| JP | 2002-216480 | 8/2002 |

* cited by examiner

*Primary Examiner* — J. H. Hur

(57) ABSTRACT

A first data amplifier connects to a first memory cell identified by an X-address signal and a selection signal obtained by predecoding a Y-address signal. A second data amplifier connects to a second memory cell identified by the X-address signal and a delayed selection signal obtained by delaying the selection signal. A generator generates a delayed operation clock signal by delaying an operation clock signal of the first data amplifier. A timing controller receives a first control signal for controlling an operation of the first data amplifier and a second control signal for controlling an operation of the second data amplifier, outputs the first control signal to the first data amplifier at a timing according to the operation clock signal, and outputs the second control signal to the second data amplifier at a timing according to the delayed operation clock signal.

5 Claims, 8 Drawing Sheets

SEMICONDUCTOR DEVICE

This application is based upon and claims the benefit of priority from Japanese patent application No. 2010-253909, filed on Nov. 12, 2010, the disclosure of which is incorporated herein in its entirety by reference.

BACKGROUND OF THE INVENTION

1. Field of the Invention

The present invention relates to a semiconductor device, and particularly to a semiconductor device including a plurality of memory cells.

2. Description of Related Art

A semiconductor device including a plurality of memory banks has been known (see JP8-221978A, JP2000-11647A, and JP2002-216480A). Each memory bank includes a plurality of memory cells that are arranged in a matrix manner.

Each memory cell includes a transistor and a capacitor. A gate of the transistor of each memory cell is connected to a word line. A source of the transistor of each memory cell is connected to the capacitor. A drain of the transistor of each memory cell is connected to a bit line. Each bit line is connected to a sense amplifier. In addition, a semiconductor device is provided with a data amplifier. The data amplifier amplifies write data, which is to be written into a memory cell, and read data that has been read from a memory cell. A Y-switch is provided between each sense amplifier and the data amplifier.

Each memory bank is connected to an XDEC (X-decoder) and a YDEC (Y-decoder). The XDEC selects a word line according to an X-address signal. The YDEC selects a Y-switch according to a Y-switch selection signal (hereinafter referred to as a "YS selection signal") corresponding to a Y-address signal, and turns on the Y-switch that is selected.

When the YDEC selects a Y-switch and turns on the selected Y-switch, it means that the YDEC selects a sense amplifier connected with the turned-on Y-switch, and moreover that the YDEC selects a bit line connected with the sense amplifier.

The data amplifier connects to a memory cell, which is identified by the X-address signal and by the Y-address signal, through the Y-switch that is turned on by the YDEC and through the sense amplifier that is connected with the Y-switch.

The data amplifier receives a data amplifier control signal, and operates according to the data amplifier control signal.

For example, when the data amplifier receives a data amplifier control signal, which indicates a reading of data, and when the data amplifier connects to a memory cell, the data amplifier receives data written into the memory cell and amplifies the data (hereinafter referred to as "read data").

Further, when the data amplifier receives a data amplifier control signal, which indicates writing of data, and data to be written (hereinafter referred to as "write data") and when the data amplifier connects to a memory cell, the data amplifier amplifies the write data and outputs the write data that is amplified to a sense amplifier.

A semiconductor device (hereinafter referred to as a "divided memory semiconductor device") is assumed in which a memory bank is divided into a plurality of memory areas, each memory area is provided with a YDEC, YDECs that are connected in series, a YS selection signal is supplied from an end of a series circuit composed of the YDECs, and each memory area is provided with a data amplifier.

The inventor has found that such a divided semiconductor device has a problem in which it is difficult to prevent an increase in circuit size.

The problem found by the inventors will be described below.

In the above described divided memory semiconductor device, a YS selection signal may degrade while passing through a YDEC which has first received the YS selection signal (hereinafter referred to as a "first YDEC"). The degradation of a YS selection signal can cause operational failure of a YDEC. To prevent degradation of the YS selection signal, a repeater may be provided between YDECs.

However, if a repeater is provided, a YS selection signal will be delayed by the repeater.

Accordingly, timing when a YDEC (hereinafter referred to as a "second YDEC"), which receives a YS selection signal through the first YDEC and through the repeater, turns on the Y-switch, that is, timing, when the second YDEC selects a sense amplifier, is delayed by a delay due to a repeater, from timing when a second YDEC selects a sense amplifier in a condition where there is no repeater.

Therefore, to make a timing to select a sense amplifier coincide with timing to input a data amplifier control signal into a data amplifier, timing to output the data amplifier control signal to a data amplifier, which is connected with the sense amplifier selected by the second YDEC, needs to be delayed by a delay caused when the second YDEC selects the sense amplifier, that is, a delay due to the repeater.

FIG. 1 is a diagram illustrating an example of output controller 101 which delays output timing of a data amplifier control signal. Output controller 101 shown in FIG. 1 is used in a semiconductor device including first and second memory areas into which a memory bank is divided in the wiring direction of a word line.

In FIG. 1, output controller 101 is connected to data amplifiers 102a and 102b.

Data amplifier 102a is connected to a memory cell identified by an X-address signal and by a Y-address signal via a sense amplifier selected by a first YDEC. Data amplifier 102b is connected to a memory cell identified by an X-address signal and by a Y-address signal via a sense amplifier selected by a second YDEC.

Output controller 101 includes a plurality of D-latches 101a, a plurality of D-latches 101b, a plurality of AND gate circuits 101c, a plurality of AND gate circuits 101d, and a plurality of delay circuits 101e.

Output controller 101 receives a data amplifier control signal "a" and a data amplifier control signal "b". Such data amplifier control signals "a" and "b" are signals composed of a plurality of bits.

A data amplifier control signal "a" composed of a plurality of bits is latched by D-latches 101a in parallel at the rising edge timing of read/write clock RWCLK, and after that, when the read/write clock RWCLK is "H", the data amplifier control signal "a" passes through AND gate circuits 101c and is outputted to data amplifier 102a in parallel.

A data amplifier control signal "b" composed of a plurality of bits is latched by D-latches 101b in parallel at the rising edge timing of the read/write clock RWCLK, and after that, when the read/write clock RWCLK is "H", the data amplifier control signal "b" passes through AND gate circuits 101d. Then, each bit of the data amplifier control signal "b" is delayed in respective delay circuits 101e and outputted to data amplifier 102b in parallel. The amount of delay for delay circuits 101e is set to the amount of delay in the repeater.

In output controller 101, each bit of the data amplifier control signal "b" is delayed. Thereby, control timing of a data amplifier can be synchronized with timing to select a sense amplifier. Therefore, data reading and writing operations can be performed precisely.

However, in output controller 101, delay circuits 101*e* is provided for each bit of data amplifier control signal "b", and accordingly, the number of the delay circuits is equal to the number of bits of the data amplifier control signal. Thus, the circuit size of the semiconductor device is increased.

SUMMARY OF THE INVENTION

A semiconductor device according to an exemplary embodiment includes memory cells, a first data amplifier, a second data amplifier, a generator, and a timing controller.

Each of the memory cells that are arranged in a matrix manner is identified by an X-address signal and a Y-address signal.

The first data amplifier connects to a first memory cell identified among the memory cells by the X-address signal and a selection signal obtained by predecoding the Y-address signal. The first data amplifier amplifies data read from the first memory cell during a read operation. The first data amplifier amplifies data to be written into the first memory cell during a write operation.

The second data amplifier connects to a second memory cell identified among the memory cells by the X-address signal and a delayed selection signal obtained by delaying the selection signal. The second data amplifier amplifies data read from the second memory cell during a read operation. The second data amplifier amplifies data to be written into the second memory cell during a write operation.

The generator generates a delayed operation clock signal by delaying an operation clock signal that defines operation timing of the first data amplifier.

The timing controller receives a first control signal that controls operation of the first data amplifier and a second control signal that controls operation of the second data amplifier. The timing controller outputs the first control signal to the first data amplifier at timing according to the operation clock signal, and outputs the second control signal to the second data amplifier at timing according to the delayed operation clock signal.

The above and other objects, features, and advantages of the present invention will become apparent from the following description with reference to the accompanying drawings which illustrate an example of the present invention.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 2:
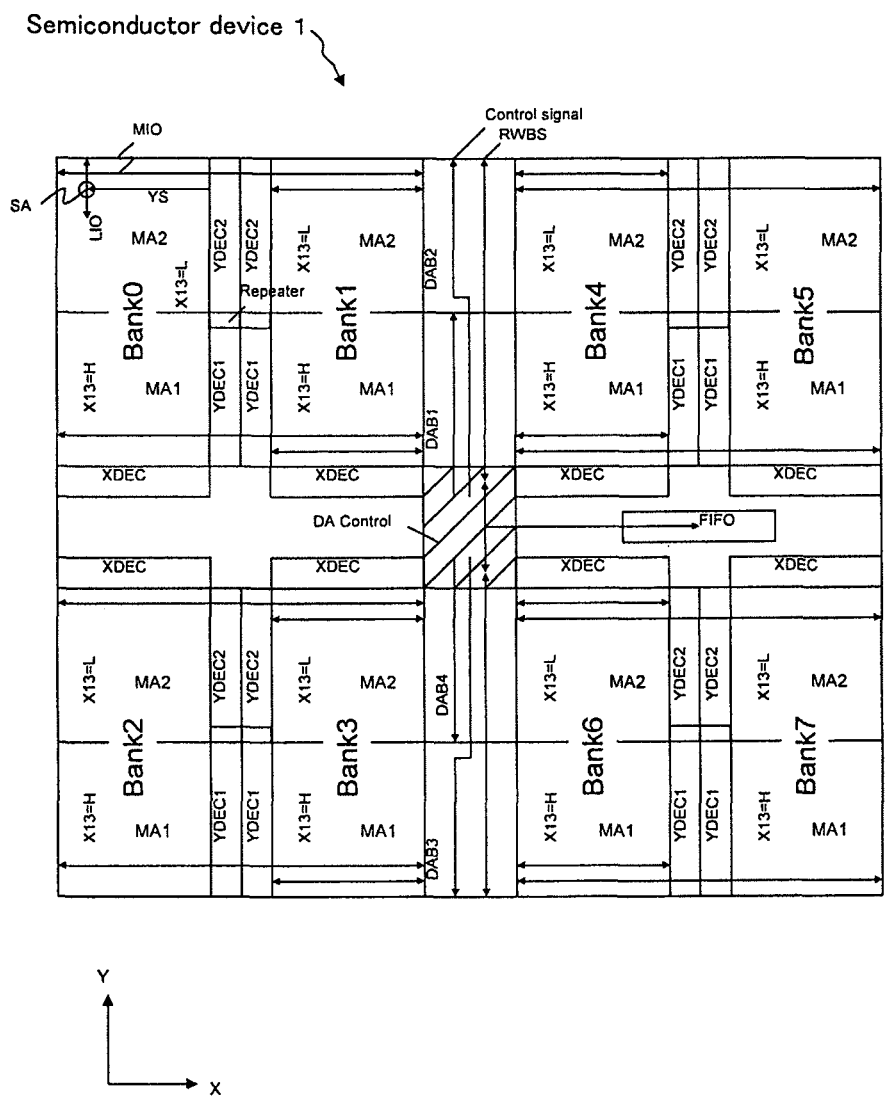
FIG. 2 is a diagram illustrating a schematic layout on a semiconductor chip of semiconductor device 1 of an exemplary embodiment.

FIG. 2 is a diagram illustrating a schematic layout on a semiconductor chip of semiconductor device 1 of an exemplary embodiment. It is noted that semiconductor device 1 also includes a circuit which is not shown in FIG. 2.

In FIG. 2, semiconductor device 1 includes eight memory banks Bank0 to Bank7. The number of memory banks is not limited to eight. Each of memory banks Bank0 to Bank7 is provided with a plurality of memory cells, each of which is arranged at an intersection of word lines and bit lines in a matrix manner and is identified by an X-address signal and a Y-address signal.

Each memory cell includes a transistor and a capacitor. A gate of the transistor of each memory cell is connected to a word line, and a source of the transistor of each memory cell is connected to a capacitor. A drain of the transistor of each memory cell is connected to a bit line. Each bit line is connected to sense amplifier SA.

Each word line is arranged to extend in a Y direction in each memory bank Bank0 to Bank7. Each bit line is arranged to extend in an X direction perpendicular to word lines.

Each of the memory banks Bank0 to Bank7 is divided into first memory area MA1 and second memory area MA2 in the wiring direction of word lines (the Y direction).

Each memory cell is identified by a 14-bit X-address signal composed of X0 to X13 and a Y-address signal.

An X-address signal is used for identifying a work line. In the exemplary embodiment, one of the word lines arranged in the X direction is selected using 13 bits X0 to X12, and one of the word lines from memory area MA1 and memory area MA2 is selected using X13. Memory area MA1 is an area in which there is a memory cell which is identified when bit X13 of an X-address signal is "H". Memory area MA2 is an area in which there is a memory cell which is identified when bit X13 is "L".

A Y-address signal is used for identifying a bit line, and further for identifying sense amplifier SA connected with the bit line, and furthermore for identifying a Y-switch connected with that sense amplifier SA.

Around each of memory banks Bank0 to Bank7, one X-decoder XDEC and two Y-decoders YDEC1 to YDEC2 are provided. Y-decoder YDEC1 is an example of a first Y-decoder, and Y-decoder YDEC2 is an example of a second Y-decoder.

X-decoder XDEC selects a word line according to an X-address signal. Y-decoder YDEC1 selects a Y-switch within memory area MA1 according to a YS selection signal corresponding to a Y-address signal, and turns on the selected Y-switch. Y-decoder YDEC2 selects a Y-switch within memory area MA2 according to the YS selection signal, and turns on the selected Y-switch. A YS selection signal is a selection signal generated by predecoding a Y-address signal.

Repeater R is connected between Y-decoder YDEC1 and Y-decoder YDEC2. Y-decoder YDEC1, repeater R and Y-decoder YDEC2 are connected in series. A YS selection signal is inputted to Y-decoder YDEC1, and then amplified and shaped over time by repeater R. The amplified and shaped YS selection signal is inputted to Y-decoder YDEC2. The YS selection signal outputted from the repeater R is an example of a delayed selection signal.

X-decoder XDEC and Y-decoder YDEC1 are included in a first identifying unit. The first identifying unit identifies a memory cell (a first memory cell) in memory area MA1 according to an X-address signal and a YS selection signal. In the exemplary embodiment, the first identifying unit identifies as the first memory cell a memory cell at the intersection of a word line selected by X-decoder XDEC and a bit line selected by Y-decoder YDEC1.

On the other hand, X-decoder XDEC and Y-decoder YDEC2 are included in a second identifying unit. The second identifying unit identifies a memory cell (a second memory cell) in memory area MA2 according to an X-address signal and a YS selection signal outputted from repeater R. In the exemplary embodiment, the second identifying unit identifies as the second memory cell a memory cell at the intersection of a word line selected by X-decoder XDEC and a bit line selected by Y-decoder YDEC2.

Data amplifier block DAB1 is provided between memory area MA1 of memory bank Bank1 and memory area MA1 of memory bank Bank4. Data amplifier block DAB2 is provided between memory area MA2 of memory bank Bank1 and memory area MA2 of memory bank Bank4.

Further, data amplifier block DAB3 is provided between memory area MA1 of memory bank Bank3 and memory area MA1 of memory bank Bank6. Data amplifier block DAB4 is provided between memory area MA2 of memory bank Bank3 and memory area MA2 of memory bank Bank6.

Data amplifier block DAB1 is an example of the first data amplifier, and can be connected to a memory cell in each memory area MA1 of memory banks Bank0 to Bank1 and Bank4 to Bank5. Data amplifier block DAB1 amplifies data read from the first memory cell in memory area MA1 during a read operation, and amplifies data to be written into the first memory cell during a write operation.

Data amplifier block DAB2 is an example of the second data amplifier, and can be connected to a memory cell in each memory area MA2 of memory banks Bank0 to Bank1 and Bank4 to Bank5. Data amplifier block DAB2 amplifies data read from the second memory cell in memory area MA2 during a read operation, and amplifies data to be written into the second memory cell during a write operation.

Data amplifier block DAB3 is an example of the first data amplifier, and can be connected to a memory cell in each memory area MA1 of memory banks Bank2 to Bank3 and Bank6 to Bank7. Data amplifier block DAB3 amplifies data read from the first memory cell in memory area MA1 during a read operation, and amplifies data to be written into the first memory cell during a write operation.

Data amplifier block DAB4 is an example of the second data amplifier, and can be connected to a memory cell in each memory area MA2 of memory banks Bank2 to Bank3 and Bank6 to Bank7. Data amplifier block DAB4 amplifies data read from the second memory cell in memory area MA2 during a read operation, and amplifies data to be written into the second memory cell during a write operation.

Each of data amplifier blocks DAB1 to DAB4 is connected with a memory cell through main I/O line MIO arranged in the X direction, local I/O line LIO arranged in the Y direction, a Y-switch, and sense amplifier SA.

Between data amplifier block DAB1 and data amplifier block DB4, data amplifier controller DAControl that controls each data amplifier block is provided.

Figure 3:
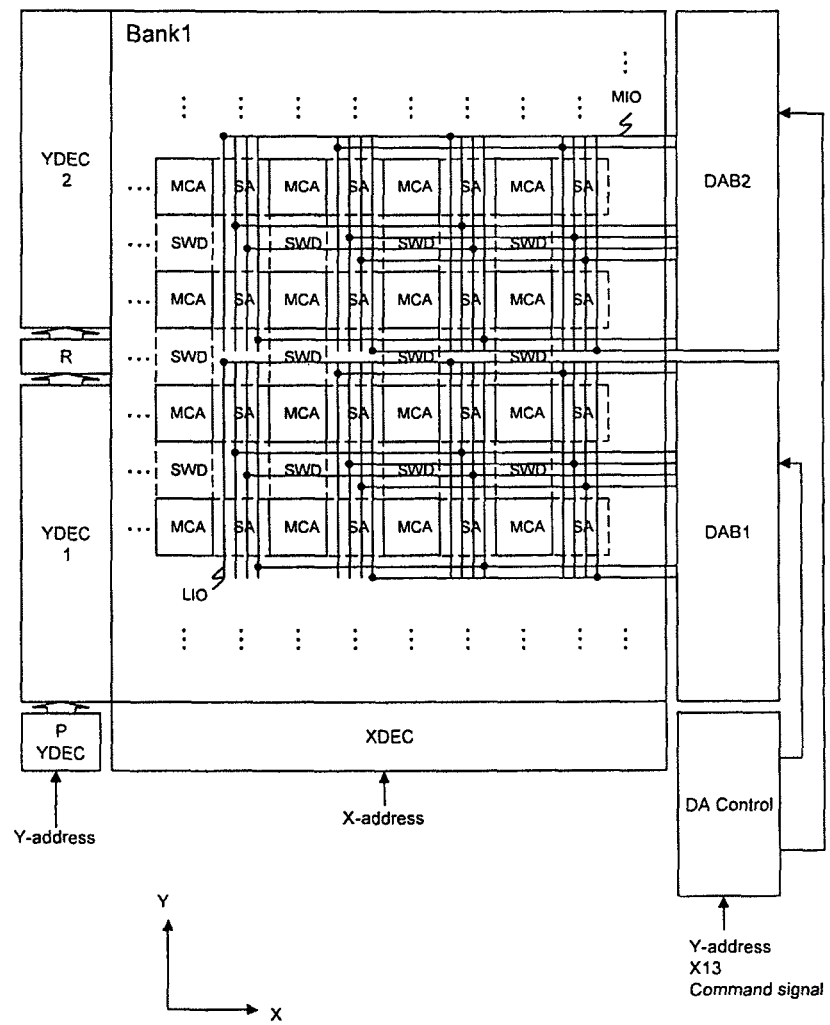
FIG. 3 is a diagram illustrating a configuration of memory bank Bank1.

FIG. 3 is a diagram illustrating a configuration of memory bank Bank1. In FIG. 3, the same components as shown in FIG. 2 are given the same reference symbols. Memory banks Bank0 and Bank2 to Bank7 have the same configuration as memory bank Bank1. Therefore, configurations of memory banks Bank0 and Bank2 to Bank7 will not be described here.

In FIG. 3, memory bank Bank1 includes memory cell arrays MCA laid out in a matrix manner.

Sub-word drivers SWD are arranged between memory cell arrays MCA adjacent to each other in the Y direction. Sub-word drivers SWD activate word line in memory cell arrays MCA (sub-word lines, which are arranged in the Y direction).

Sense amplifiers SA and Y-switches (not shown) are arranged between memory cell arrays MCA adjacent to each other in the X direction. Sense amplifiers SA and Y-switches drive bit lines (extended in the X direction) in memory cell arrays MCA. Each different local I/O line pair LIO is assigned to each memory cell array MCA.

Figure 4:
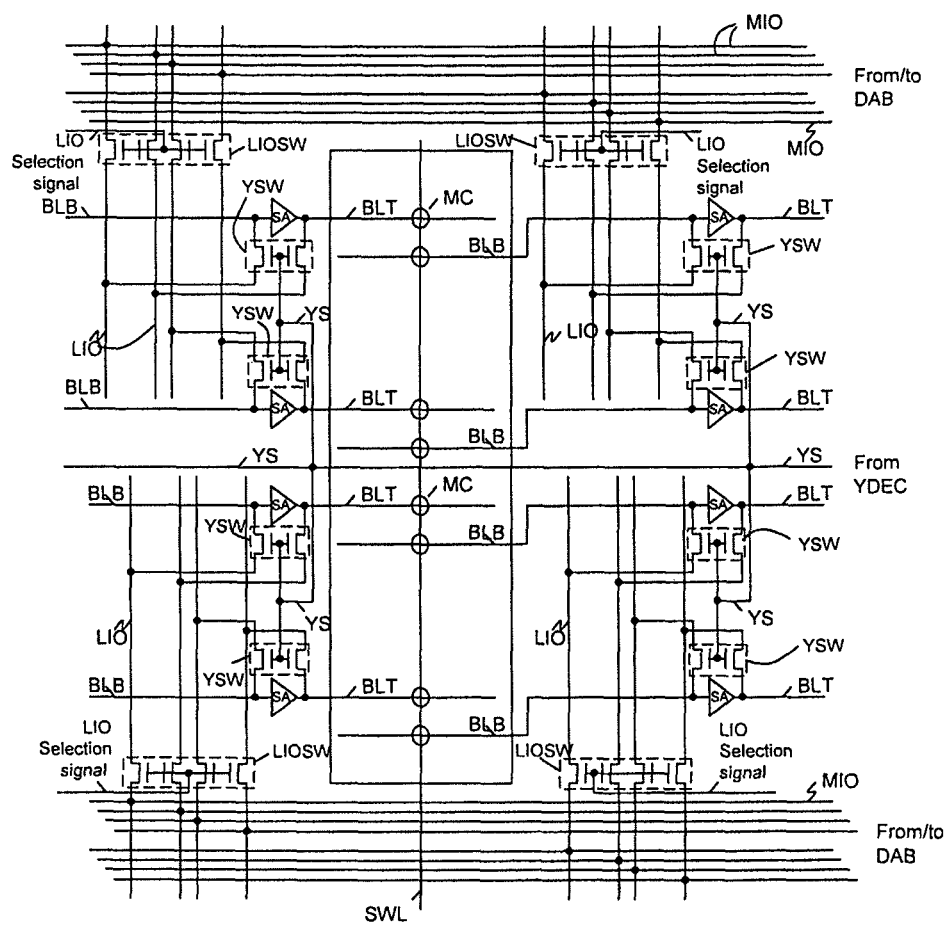
FIG. 4 is a diagram illustrating memory cell array MCA shown in FIG. 3 and its surroundings.

FIG. 4 is a drawing illustrating a memory cell array MCA shown in FIG. 3 and its surroundings. In FIG. 4, the same components as shown in FIG. 2 or FIG. 3 are given the same reference symbols.

In FIG. 4, local I/O switch LIOSW controls a connection between local I/O line LIO and main I/O line MIO according to an LIO selection signal. The LIO selection signal is generated by X-decoder XDEC. That is to say, X-decoder XDEC selects a word line (sub-word line) SWL based on an X-address signal, as well as generates an LIO selection signal for turning on local I/O switch LIOSW which is connected to local I/O line LIO corresponding to selected word line SWL.

Sense amplifier SA amplifies a potential difference caused on bit line pair BLT/B by selection (activation) of word line (sub-word line) SWL.

An input/output node of sense amplifier SA is connected to local I/O line pair LIO corresponding to sense amplifier SA through Y-switch YSW. Y-switch YSW is controlled by a YS selection signal generated by pre-Y-decoder PYDEC shown in FIG. 3. More specifically, Y-switch YSW is controlled by Y-decoder YDEC1 or YDEC2 driven by the YS selection signal. For this reason, some sense amplifiers SA selected by a Y-address signal (eight sense amplifiers SA in the example shown in FIG. 4) among a plurality of sense amplifiers SA are connected to local I/O line pair LIO.

Pre-Y-decoder PYDEC shown in FIG. 3 is an example of a predecoder, and generates a YS selection signal by predecoding a Y-address signal.

Returning to FIG. 4, local I/O line pair LIO is connected to main I/O line pair MIO through local I/O switch LIOSW.

Main I/O line pair MIO in memory area MA1 of memory bank Bank1 is connected to data amplifier block DAB1. Main I/O line pair MIO in memory area MA2 of memory bank Bank1 is connected to data amplifier block DAB2.

In memory area MA1 of memory bank Bank1, on-off control of Y-switch YSW is performed by Y-decoder YDEC1. On the other hand, in memory area MA2 of memory bank Bank1, on-off control of Y-switch YSW is performed by Y-decoder YDEC2.

When Y-decoder YDEC1 receives a YS selection signal from pre-Y-decoder PYDEC, Y-decoder YDEC1 controls on/off of Y-switch YSW in memory area MA1 of memory bank Bank1.

When Y-decoder YDEC2 receives the YS selection signal amplified by repeater R after having passed through Y-decoder YDEC1, Y-decoder YDEC2 controls on/off of Y-switch YSW in memory area MA2 of memory bank Bank1.

Therefore, a time period from a time point when a YS selection signal is outputted from pre-Y-decoder PYDEC to a time point when on/off of Y-switch YSW in memory area MA2 is controlled is longer by a time period required for amplification processing in repeater R than a time period from a time point when the YS selection signal is outputted from pre-Y-decoder PYDEC to a time point when on/off of Y-switch YSW in memory area MA1 is controlled.

Accordingly, a time period from a time point when a YS selection signal is outputted from pre-Y-decoder PYDEC to a time point when a memory cell in memory area MA2 is connected to data amplifier block DAB2 is longer by a time period required for shaping processing in repeater R than a time period from a time point when the YS selection signal is outputted from pre-Y-decoder PYDEC to a time point when a memory cell in memory area MA1 is connected to data amplifier block DAB1.

For this reason, in the exemplary embodiment, data amplifier controller DAControl delays timing to send a data amplifier control signal for data amplifier block DAB2.

Figure 1:
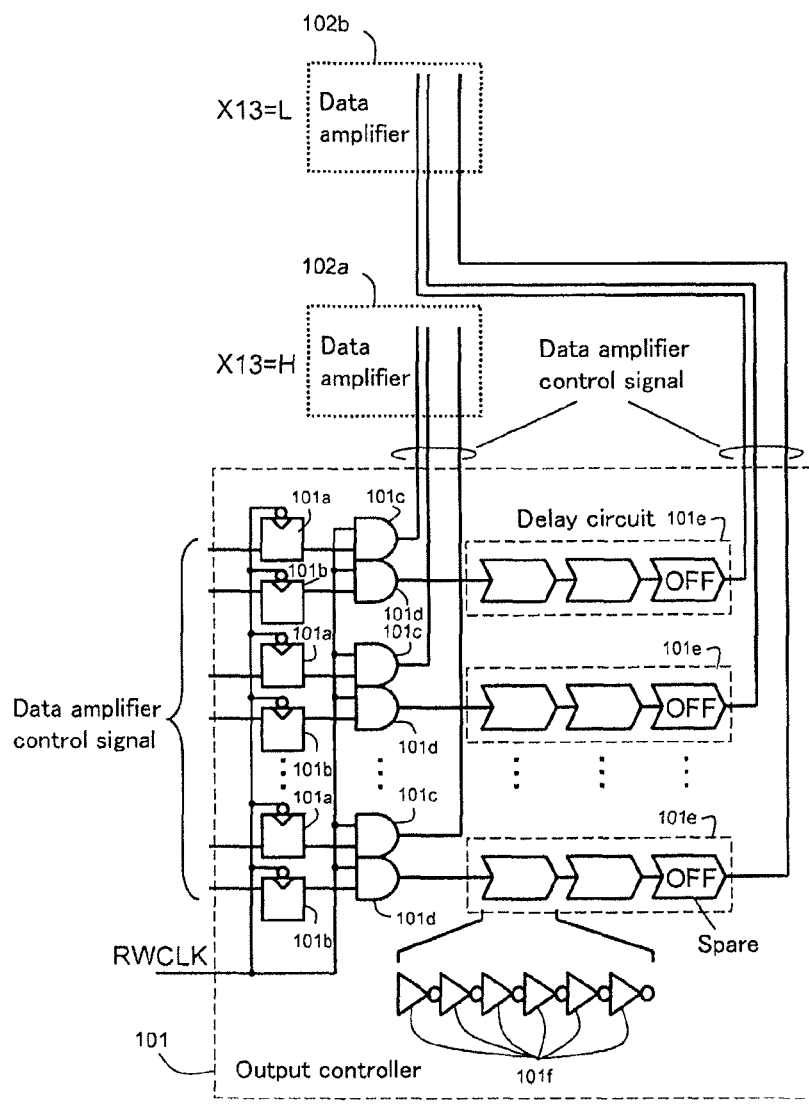
FIG. 1 is a drawing illustrating an example of output controller 101.
Figure 5:
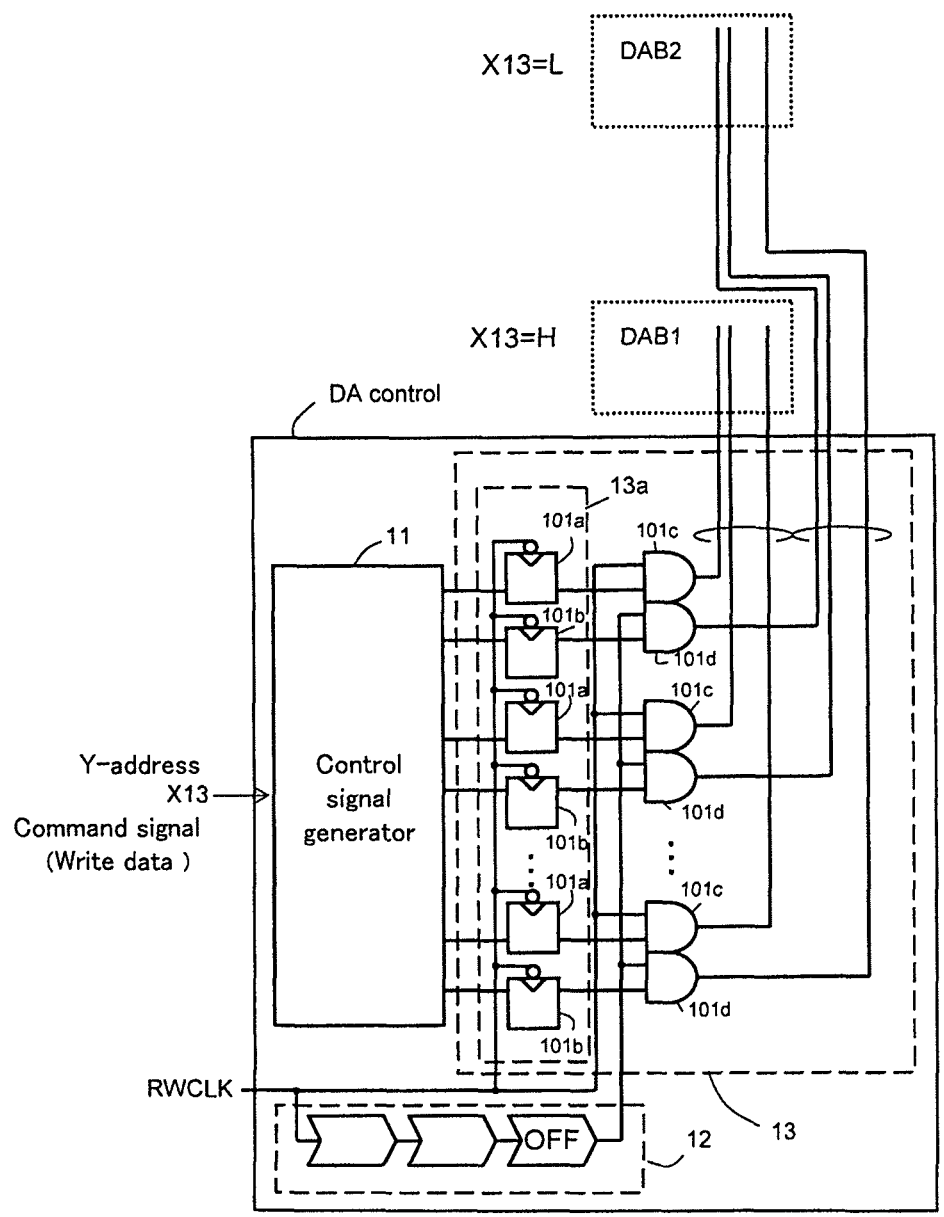
FIG. 5 is a drawing illustrating data amplifier controller DAControl shown in FIG. 3.
Figure 6:
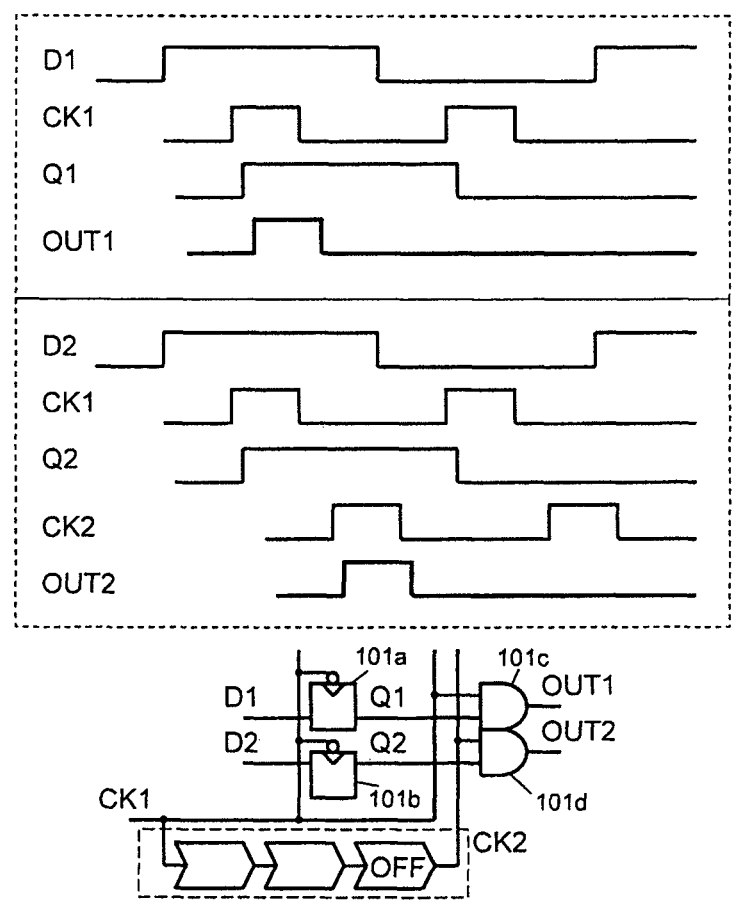
FIG. 6 is a diagram illustrating operation of timing control circuit 13.

FIG. 5 is a drawing illustrating data amplifier controller DAControl shown in FIG. 3. In FIG. 5, the same components as shown in FIG. 2 or FIG. 1 are given the same reference symbols. FIG. 6 is a diagram illustrating operation of timing control circuit 13. In FIG. 6, each of the numbers of D-latches 101a and 101b and AND gate circuits 101c and 101d is one in order to simplify illustration.

In FIG. 5, data amplifier controller DAControl includes control signal generator 11, delay generator 12, and timing controller 13. Timing controller 13 includes holder 13a, and AND gate circuits 101c and 101d. AND gate circuits 101c are an example of a first output unit, and AND gate circuits 101d are an example of a second output unit. Holder 13a includes D-latches 101a and 101b.

Control signal generator 11 receives a signal of bit X13 in an X-address signal, a Y-address signal, and a command signal providing instructions to start a read or write operation (a read command or write command). Additionally, control signal generator 11 also receives write data at the time of data writing.

Control signal generator 11 generates a multi-bit data amplifier control signal which defines operation of a data amplifier block, based on a Y-address signal and a command signal. If the command signal is a read command, control signal generator 11 generates a data amplifier control signal for controlling a read operation of the data amplifier block. If the command signal is a write command, control signal generator 11 generates a data amplifier control signal for controlling a write operation of the data amplifier block.

If X13=H, control signal generator 11 outputs a multi-bit data amplifier control signal to D-latches 101a in parallel, as the first control signal which controls operation of data amplifier block DAB1. On the other hand, if X13=L, control signal generator 11 outputs a multi-bit data amplifier control signal to D-latches 101b in parallel, as the second control signal which defines operation of data amplifier block DAB2.

Delay generator 12 generates a delayed clock by delaying read/write clock RWCLK which defines the operation timing of data amplifier block DAB1. For example, delay generator 12 generates a delayed clock by delaying read/write clock RWCLK by a time corresponding to a delay due to shaping processing in repeater R. It is noted that read/write clock RWCLK is an example of an operation clock signal, and the delayed clock is an example of a delayed operation clock signal.

Timing controller 13 receives a first control signal and a second control signal. Timing controller 13 outputs the first control signal to data amplifier block DAB1 at timing according to read/write clock RWCLK. Further, timing controller 13 outputs the second control signal to data amplifier block DAB1 at timing according to a delayed clock.

Holder 13a holds the first control signal and the second control signal at input timing of read/write clock RWCLK.

D-latches 101a latch the multi-bit data amplifier control signal (first control signal) at rising edge timing (input timing) of read/write clock RWCLK, and output the multi-bit data amplifier control signal (first control signal) to AND gate circuits 101c.

When AND gate circuits 101c receive the multi-bit data amplifier control signal, read/write clock RWCLK is "H" and accordingly AND gate circuits 101c have been opened. Therefore, the multi-bit data amplifier control signal outputted from D-latches 101a pass through AND gate circuits 101c, and are inputted to data amplifier block DAB1 (see FIG. 6).

In other words, when holder 13a holds the first control signal, AND gate circuits 101c output the first control signal held by holder 13a to data amplifier block DAB1.

On the other hand, D-latches 101b latch the multi-bit data amplifier control signal (second control signal) at the rising edge timing (input timing) of read/write clock RWCLK, and output the multi-bit data amplifier control signal (second control signal) to AND gate circuits 101d.

When AND gate circuits 101d receive the multi-bit data amplifier control signal (second control signal), the delayed clock is "L" and accordingly AND gate circuits 101c have been closed.

After that, AND gate circuits 101d are opened when the delayed clock is "H". Therefore, the multi-bit data amplifier control signal (second control signal) outputted from D-latches 101b is passed through AND gate circuits 101d and inputted to data amplifier block DAB2 (see FIG. 6).

As described above, semiconductor device 1 according to the exemplary embodiment includes: memory cells MC that are arranged in a matrix manner and identified by an X-address signal and a Y-address signal; first data amplifier DAB1 that connects to a first memory cell identified among memory cells MC by an X-address signal and a selection signal obtained by predecoding a Y-address signal (a YS selection signal), and that amplifies data read from the first memory cell during a read operation, and amplifies data to be written into the first memory cell during a write operation; second data amplifier DAB2 that connects to a second memory cell identified among memory cells MC by the X-address signal and a delayed selection signal obtained by delaying the selection signal, and that amplifies data read from the second memory cell during a read operation, and that amplifies data to be written into the second memory cell during a write operation; generator 12 that generates a delayed operation clock signal by delaying operation clock signal RWCLK that defines operation timing of first data amplifier DAB1; and timing controller 13 that receives a first control signal that controls operation of first data amplifier DAB1 and a second control signal that controls operation of second data amplifier DAB2, outputs the first control signal to first data amplifier DAB1 at timing according to operation clock signal RWCLK, and outputs the second control signal to second data amplifier DAB2 at timing according to the delayed operation clock signal.

In the exemplary embodiment, generator 12 generates the delayed operation clock signal by delaying operation clock signal RWCLK by a time corresponding to a delay of the delayed selection signal with respect to the selection signal.

Further, timing controller 13 includes: holder 13a that holds the first control signal and the second control signal at the input timing of operation clock signal RWCLK; first output unit 101c that outputs the first control signal held by the holder 13a to first data amplifier DAB1 when holder 13a holds the first control signal; and second output unit 101d that outputs the second control signal held by the holder 13a to second data amplifier DAB2 at the input timing of the delayed operation clock signal.

Further, semiconductor device 1 includes: predecoder PYDEC that generates the selection signal by predecoding the Y-address signal; a first identifying unit (XDEC, YDEC1) that identifies the first memory cell according to the X-address signal and the selection signal; repeater R that shapes the selection signal and outputs the shaped selection signal as the delayed selection signal; and second identifying unit (XDEC, YDEC2) that identifies the second memory cell according to the X-address signal and the delayed selection signal.

Furthermore, in semiconductor device 1, memory cells MC are arranged at intersections of word lines SWL and bit lines BL; memory cells MC are each divided into first memory area MA1 and second memory area MA2 in a wiring direction of word lines SWL; the first identifying unit includes X-decoder XDEC that selects word line SWL according to the X-address signal and first Y-decoder YDEC1 that selects bit line BL in first memory area MA1 according to the selection signal, and identifies as the first memory cell memory cell MC at an intersection of word line SWL selected by X-decoder XDEC and bit line BL selected by first Y-decoder YDEC1; repeater R shapes the selection signal passed from first Y-decoder YDEC1 and outputs the shaped selection signal as the delayed selection signal; and the second identifying unit includes the X-decoder and second Y-decoder YDEC2 that selects bit line BL in the second memory area according to the delayed selection signal, and identifies as the second memory cell memory cell MC at an intersection of word line SWL selected by X-decoder XDEC and bit line BL selected by second Y-decoder YDEC2.

Figure 7:
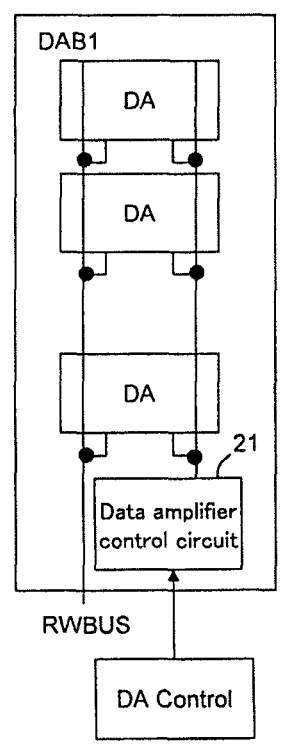
FIG. 7 is a diagram illustrating data amplifier block DAB1.

FIG. 7 is a diagram illustrating data amplifier block DAB1. In the exemplary embodiment, data amplifier blocks DAB2 to DAB4 have the same configuration as data amplifier block DAB1. Therefore, data amplifier blocks DAB2 to DAB4 will not be described here.

In FIG. 7, data amplifier block DAB1 includes data amplifier control circuit 21 and data amplifies DA.

When data amplifier control circuit 21 receives a data amplifier control signal from data amplifier controller DAControl, data amplifier control circuit 21 generates a data amplifier drive signal by decoding the data amplifier control signal.

In the exemplary embodiment, data amplifier control circuit 21 decodes the data amplifier control signal to generate as the data amplifier drive signal, a bank selection signal, an MIO equalize signal, a read amplifier control signal, and a write amplifier control signal.

Since the data amplifier control signal is a signal generated based on a signal of bit X13 of an X-address signal, a Y-address signal, and a command signal (a read command or a write command), the bank selection signal, MIO equalize signal, read amplifier control signal, and write amplifier control signal are signals based on the signal of bit X13, based on Y-address signal, and based on command signal.

Figure 8:
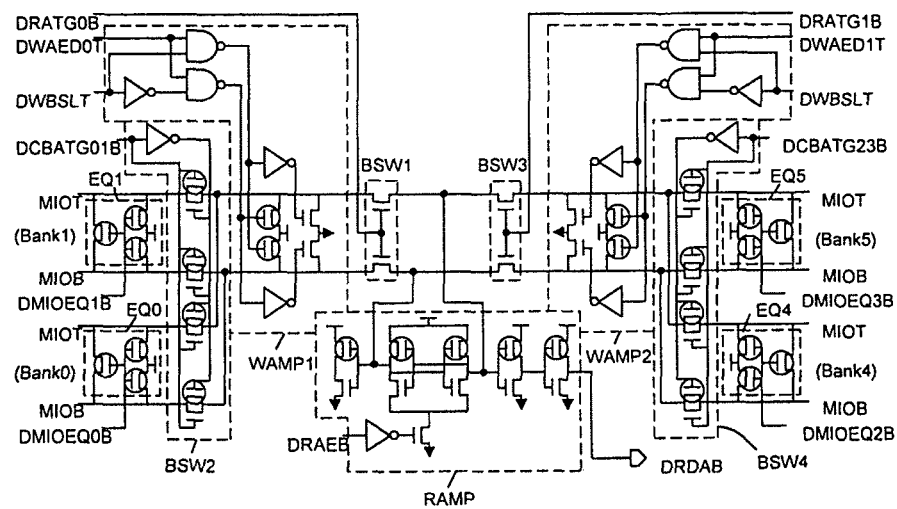
FIG. 8 is a diagram illustrating data amplifier DA.

FIG. 8 is a diagram illustrating data amplifier DA.

Data amplifier DA is connected to respective main I/O line pairs MIOT/B of memory banks Bank0 to Bank1 and Bank4 to Bank5.

Data amplifier DA includes equalizers EQ0 to EQ1 and EQ4 to EQ5, bank selection switches BSW1 to BSW4, write amplifies WAMP1 to WAMP2, and read amplifier RAMP.

Upon receiving an MIO equalize signal (DMIOEQ1B, DMIOEQ0B, DMIOEQ3B, or DMIOEQ2B) from data amplifier control circuit 21, the respective equalizer (EQ0 to EQ1, EQ4 to EQ5) performs equalization processing so that respective electric potentials of main I/O line pair MIOT/B are the same potential (a reference level).

Upon receiving a bank selection signal (DRATG0B, DCBATG01B, DRATG1B, or DCBATG23B) from data amplifier control circuit 21, the respective bank selection switch (BSW1 to BSW4) connects main I/O line pair MIOT/B from a memory bank selected by the bank selection signal, to data amplifier DA.

Upon receiving a write amplifier control signal (DWAED0T or DWAED1T) and write data DWBSLT from data amplifier control circuit 21, the respective write amplifier (WAMP1 to WAMP2) amplifies write data DWBSLT.

Upon receiving a read amplifier control signal (DRAEB) from data amplifier control circuit 21, read amplifier RAMP amplifies read data received through main I/O line pair MIOT/B connected with data amplifier DA, and outputs the amplified read data (DRDAB).

Data amplifier DA operates according to a data amplifier drive signal.

For example, according to a data amplifier drive signal, data amplifier DA performs processing for equalization of main I/O line pair MIOT/B by the equalizer, determines whether to turn each bank selection switch on or off, amplifies write data DWBSLT by the write amplifier, and outputs amplified write data DWBSLT to the memory cell connected with data amplifier DA.

Further, according to a data amplifier drive signal, data amplifier DA performs processing for equalization of main I/O line pair MIOT/B by the equalizer, determines whether to turn each bank selection switch on or off, amplifies read data which has been read from the memory cell connected with data amplifier DA by read amplifier RAMP, and outputs the amplified read data.

According to the exemplary embodiment, delay generator 12 generates a delayed clock signal by delaying read/write clock RWCLK. Timing controller 13 receives a first control signal for controlling data amplifier block DAB1, and a second control signal for controlling data amplifier block DAB2. Timing controller 13 outputs the first control signal to data amplifier block DAB1 at timing according to read/write clock RWCLK, and outputs the second control signal to data amplifier block DAB2 at timing according to the delayed clock.

Therefore, as a component for generating a delay time of output timing of a second control signal, delay generator 12 that delays an operation clock signal is just provided.

Thereby, the configuration for delaying output timing of a second control signal can be reduced compared to the case where delay circuits, the number of which equals the number of bits of a second digital signal, are provided for delaying output timing of a second control signal (see FIG. 1), so that an increase in the circuit size of semiconductor device 1 can be prevented.

Preferably, delay generator 12 generates a delayed clock signal by delaying read/write clock RWCLK by a time corresponding to a delay of a delayed YS selection signal with respect to the YS selection signal. In this case, operation timing of Y-decoder YDEC2 and operation timing of data amplifier block DAB2 can be synchronized with high precision. Therefore, data can be read and written precisely.

In the exemplary embodiment, holder 13a holds a first control signal and a second control signal at input timing of read/write clock RWCLK. When holder 13a holds the first control signal, AND gate circuits 101c output the first control signal held by holder 13a to data amplifier block DAB2. AND gate circuits 101d output the second control signal held by holder 13a to data amplifier block DAB2 at the input timing of a delayed clock signal.

In this case, by the difference between the input timing of read/write clock RWCLK and the input timing of the delayed clock signal, the output timing of the second control signal can be delayed.

In the exemplary embodiment, repeater R takes time to shape a YS selection signal having passed through Y-decoder YDEC1, and outputs the shaped YS selection signal to Y-decoder YDEC2 as a delayed YS selection signal. In this case, the YS selection signal to be inputted to Y-decoder YDEC2 can be prevented from being degraded while an increase in the circuit size of the semiconductor device 1 can be prevented.

It is apparent that the present invention is not limited to the above embodiments, but may be modified and changed without departing from the scope and spirit of the invention.

What is claimed is:

1. A semiconductor device comprising:
   a plurality of memory cells that are arranged in a matrix manner and identified by an X-address signal and a Y-address signal;
   a first data amplifier that connects to a first memory cell identified among the plurality of memory cells by an X-address signal and a selection signal obtained by pre-decoding a Y-address signal, amplifies data read from the first memory cell during a read operation, and amplifies data to be written into the first memory cell during a write operation;
   a second data amplifier that connects to a second memory cell identified among the plurality of memory cells by the X-address signal and a delayed selection signal obtained by delaying the selection signal, amplifies data read from the second memory cell during a read operation, and amplifies data to be written into the second memory cell during a write operation;
   a generator that generates a delayed operation clock signal by delaying an operation clock signal that defines an operation timing of said first data amplifier; and
   a timing controller that receives a first control signal that controls operation of said first data amplifier and a second control signal that controls operation of said second data amplifier, outputs the first control signal to said first data amplifier at timing according to the operation clock signal, and outputs the second control signal to said second data amplifier at a timing according to the delayed operation clock signal.

2. The semiconductor device according to claim 1, wherein said generator generates the delayed operation clock signal by delaying the operation clock signal by a time corresponding to a delay time of the delayed selection signal to the selection signal.

3. The semiconductor device according to claim 1, wherein said timing controller comprises:
   a holder that holds the first control signal and the second control signal at an input timing of the operation clock signal;
   a first output unit that outputs the first control signal held by said holder to said first data amplifier when said holder holds the first control signal; and
   a second output unit that outputs the second control signal held by said holder to said second data amplifier at an input timing of the delayed operation clock signal.

4. The semiconductor device according to claim 1, further comprising:
   a predecoder that generates the selection signal by predecoding the Y-address signal;
   a first identifying unit that identifies the first memory cell according to the X-address signal and the selection signal;
   a repeater that shapes the selection signal and outputs the shaped selection signal as the delayed selection signal; and
   a second identifying unit that identifies the second memory cell according to the X-address signal and the delayed selection signal.

5. The semiconductor device according to claim 4,
   wherein the memory cells are arranged at intersections of word lines and bit lines,
   wherein the memory cells are each divided into a first memory area and a second memory area in a wiring direction of the word lines,
   wherein said first identifying unit comprises an X-decoder that selects a word line from the word lines according to the X-address signal and a first Y-decoder that selects a bit line in the first memory area according to the selection signal, and identifies as the first memory cell a memory cell at an intersection of the word line selected by said X-decoder and the bit line selected by said first Y-decoder,
   wherein said repeater shapes the selection signal passed from said first Y-decoder and outputs the shaped selection signal as the delayed selection signal, and
   wherein said second identifying unit comprises said X-decoder and a second Y-decoder that selects a bit line in the second memory area according to the delayed selection signal, and identifies as the second memory cell a memory cell at an intersection of the word line selected by said X-decoder and the bit line selected by said second Y-decoder.

* * * * *